(12) United States Patent
Kantorovich et al.

(10) Patent No.: US 7,102,357 B2
(45) Date of Patent: Sep. 5, 2006

(54) DETERMINATION OF WORST CASE VOLTAGE IN A POWER SUPPLY LOOP

(75) Inventors: Isaac Kantorovich, Chestnut Hill, MA (US); Victor Arnoldovich Drabkin, Swampscott, MA (US); Christopher Lee Houghton, Westborough, MA (US); James J. St. Laurent, Oakham, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/805,942

(22) Filed: Mar. 22, 2004

(65) Prior Publication Data
US 2005/0206392 A1  Sep. 22, 2005

(51) Int. Cl.
*G01R 31/08* (2006.01)
*G06F 15/00* (2006.01)

(52) U.S. Cl. .................. 324/522; 324/765; 324/525; 324/629; 324/649; 702/64; 702/65; 702/117; 702/124; 702/189

(58) Field of Classification Search ............... 713/340; 324/522, 765, 132, 525, 629, 649; 702/60, 702/64–66, 69, 75, 117–118, 124, 189
See application file for complete search history.

(56) References Cited

U.S. PATENT DOCUMENTS

| | | | |
|---|---|---|---|
| 5,483,170 A * | 1/1996 | Beasley et al. | 324/537 |
| 5,726,997 A * | 3/1998 | Teene | 714/726 |
| 5,949,798 A * | 9/1999 | Sakaguchi | 371/27.1 |
| 5,963,038 A | 10/1999 | De Jong et al. | |
| 6,002,264 A | 12/1999 | Gilbert et al. | |
| 6,239,587 B1 | 5/2001 | Buck | |
| 6,337,571 B1 | 1/2002 | Maddala et al. | |
| 6,472,899 B1 * | 10/2002 | Osburn et al. | 324/765 |
| 6,518,782 B1 | 2/2003 | Turner | |

* cited by examiner

*Primary Examiner*—Diane Lee
*Assistant Examiner*—Marina Kramskaya

(57) ABSTRACT

Various systems, methods, and programs embodied in a computer readable medium are provided for determining a worst-case impedance and worst-case voltage of a power supply loop coupled to a power input of a die. In various embodiments, the worst-case impedance of a power supply loop is determined and a reference voltage at the power input of the die associated with an average current generated at a power supply included in the power supply loop. A maximum change in a current at the power input of the die is also measured and an estimate of a worst-case voltage at the power input of the die is calculated based upon the worst-case impedance, the reference voltage, and the maximum change in the current.

23 Claims, 9 Drawing Sheets

DETERMINATION OF WORST CASE VOLTAGE IN A POWER SUPPLY LOOP

BACKGROUND

Development of microprocessor technology has seen decreasing power supply voltages that are more susceptible to interference by noise, decreasing signal transition times, decreasing die sizes, increasing power supply currents, and increasing clock speeds. As a result, ever more significant demands are placed upon the power supplies of microprocessor circuits. Such demands typically result in significant voltage and current variation between power and ground conductors.

Knowledge as to the nature of the extreme voltages that occur between a microprocessor power and ground due to the operation of a microprocessor or other type of circuit is useful for estimating power distribution performance and for predicting signal integrity in a microprocessor. However, current approaches are inadequate to determine such extreme voltages.

BRIEF DESCRIPTION OF THE DRAWINGS

The invention can be understood with reference to the following drawings. The components in the drawings are not necessarily to scale. Also, in the drawings, like reference numerals designate corresponding parts throughout the several views.

DETAILED DESCRIPTION

Figure 1:
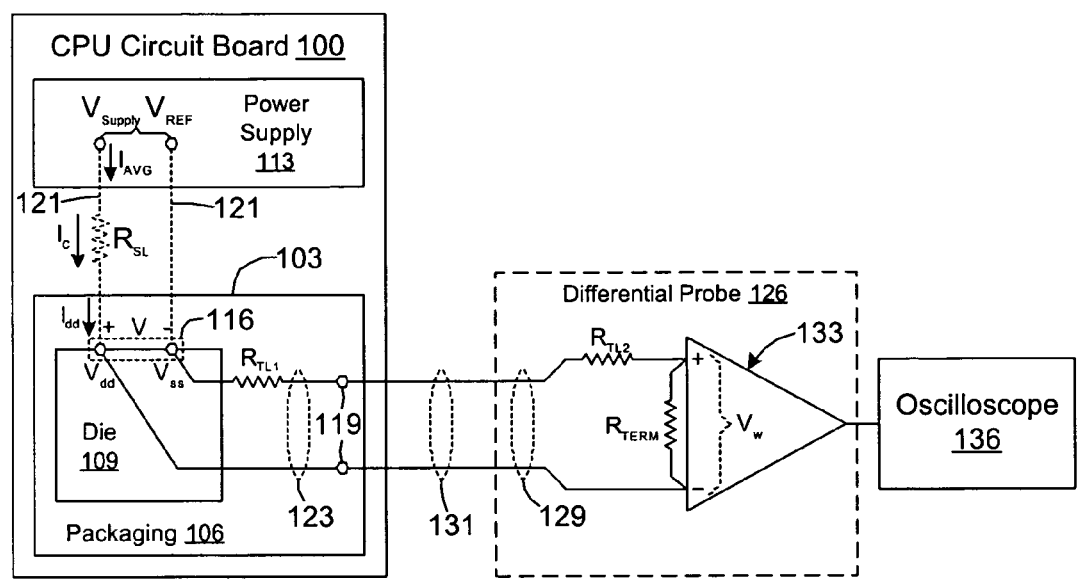
FIG. 1 is a schematic block diagram of an example of a circuit board that includes packaging and a die that is coupled to a power supply, the power supply generating a current that is measured using a differential probe according to the various embodiments of the present invention.

With reference to FIG. 1, shown is a schematic block diagram of a central processing unit (CPU) circuit board 100 upon which is mounted a CPU package 103. The CPU package 103 comprises packaging 106 and at least one semiconductor die 109. In addition, a power supply 113 is also included on the CPU circuit board 100. In other embodiments, the power supply 113 may be located within the CPU package 103. The power supply 113 may be, for example, a voltage regulator or other appropriate device or circuit as can be appreciated by those with ordinary skill in the art. The power supply 113 generates voltage $V_{supply}$ and current $I_{dd}$ that is seen at a power input 116 of the die 109. The CPU package 103 includes test points 119 that facilitate measuring the voltage V across the power input 116 of the die 109. Specifically, the voltage V is the difference between the voltage $V_{dd}$ and the common $V_{ss}$.

The power supply 113 generates system voltage $V_{Supply}$ that is supplied to the die 109 during operation of the die 109. The voltage $V_{Supply}$ is the voltage between power and ground. A power supply loop exists that includes the power supply 113 and the conductors 121 that couple the power supply 113 to the power input 116 of the die 109. Such conductors 121 may include, for example, a ground plane (i.e. solid or grid), a power plane (i.e. solid or grid), vias, traces, de-coupling capacitors, bumps, and/or other circuit elements. The voltage V is seen at the power input 116 of the die 109, where $V=V_{dd}-V_{ss}$. In this respect, the voltage V may not equal the voltage $V_{Supply}$ due to the impedance in the conductors between the power supply 113 and the power input of the die 109 and due to other circumstances as can be appreciated by those with ordinary skill in the art. The power supply 113 may also provide voltage and current to other components (not shown) in the packaging 106 and on the CPU circuit board 100.

In order to allow a user to measure the voltage V across $V_{dd}$ and $V_{ss}$, conductors are provided that link $V_{dd}$ and $V_{ss}$ to the test points 119. These conductors make up a transmission line 123 between the voltage V input of the die 109 to the test points 119. The transmission line 123 includes resistance $R_{TL1}$.

A differential probe 126 is employed to obtain a measure of the voltage V. The differential probe 126 includes cables or other conductors that make up a transmission line 129 that is coupled to the inputs of a comparator 133. The transmission line 129 includes resistance $R_{TL2}$. The transmission line 129 is configured to contact the test points 119 on the CPU package 103. Together, the transmission lines 123 and 129 make up a transmission line 131 between the power input 116 of the die 109 and the inputs of the comparator 133 of the differential probe 126. In this respect, the resistance of the transmission line 131 is noted as $R_{TL}$ which is the sum of the resistances $R_{TL1}$ and $R_{TL2}$. In this respect, the characteristic impedance of the transmission lines 123 and 129 are matched as close a possible so as to minimize reflections at the junction between the transmission lines 123 and 129 as can be appreciated.

The differential probe 126 may include a terminal resistance $R_{TERM}$ that is coupled across the inputs to the comparator 133. The output of the differential probe 126 is applied to an oscilloscope 136 to view the resulting waveform. A voltage $V_w$ is specified as the voltage across the terminal resistor $R_{TERM}$ that is input into the comparator 133.

The differential probe 126 is employed, for example, to measure the voltage V at the power input of the die 109. The resistance of the termination resistance $R_{TERM}$ is calculated so as to minimize reflection of the voltage signals reaching the comparator 133. However, given that such reflections are generally of high frequency, the termination resistance $R_{TERM}$ may not be necessary if high frequency reflections or noise is of no concern. In such a case, the high frequency noise may be filtered out of the signal obtained as will be described. To measure the voltage V, the conductor that make up the transmission line 129 are coupled to the test points 119. In the case that the termination resistance $R_{TERM}$ is employed, the voltage $V_w$ is measured over a period of time ($V_w(t)$) and is stored in a memory associated, for example, with the oscilloscope 136. The voltage V(t) may then be calculated from the voltage $V_w(t)$, the termination resistance $R_{TERM}$, and the transmission line resistance $R_{TL}$ of the transmission line 131.

If the termination resistance $R_{TERM}$ is not employed, then the voltage V may be measured and stored as a function of time (V(t)) in a memory associated, for example, with the oscilloscope 136. In such case, it is assumed that the voltage V(t) is the same as the voltage $V_w(t)$ measured across the inputs of the comparator 133 since the comparator 133 includes a near infinite input resistance and there is negligible current on the transmission line 131. The voltage V(t) may be stored, for example, on a computer readable medium that is accessed for further analysis and calculation as will be discussed. In addition, the voltage V(t) may be subjected to filter to eliminate or minimize any unwanted high frequency components as mentioned above when the voltage V(t) is measured without the termination resistance $R_{TERM}$. For a more detailed discussion of the measuring of the voltage V as described herein, reference is made to US Patent Application entitled "Measuring Current on a Die" filed on Dec. 22, 2003 and assigned Ser. No. 10/745,101.

Any one of a number of processes may be executed on the die 109 while various measurements of the voltage and current at the power supply 113 and the power input 116 of the die 109 are obtained. For example, one such process is defined herein as a "cold" process that includes any algorithm that generates a low power requirement on the die 109 resulting in a relatively low constant current $I_{dd}$ when executed on the die 109. Such a cold process may be, for example, a process that merely includes the running of a clock associated with the die 109 at a relatively low frequency. In this respect, the current $I_{dd}$ increases or decreases with a corresponding increase or decrease in the clock frequency. The low current $I_{dd}$ generated by the cold process may experience some fluctuation. Consequently, it is understood that to be "relatively constant" as contemplated herein means to be constant to the extent practicable under the circumstances. Alternatively, other algorithms may be employed that effectively serve as cold processes to generate the relatively low constant current $I_{dd}$ as contemplated herein.

A "hot" process is any algorithm that generates a high power requirement on the die 109 resulting in a relatively high constant current $I_{dd}$ when executed on the die 109. In this respect, the relatively high constant current $I_{dd}$ is generally greater than the relatively low constant current $I_{dd}$ generated by the cold process. For example, a hot process may be a process that runs a clock associated with the die 109 at a relatively high frequency given that the current $I_{dd}$ generally increases with an increase in the clock frequency. Also, such an algorithm may include repeated instructions such as repeated AND instructions, repeated OR instructions, or other repeated instructions. The repeated instructions and the high frequency clock that occur during the execution of a hot process results in the relatively high constant current $I_{dd}$. Alternatively, other algorithms may be employed that effectively serve as hot processes as contemplated herein.

An "aggressive" process involves an algorithm that results in significant fluctuation of the current $I_{dd}$ when executed on the die 109. In this respect, an aggressive process may involve switching of memories, control of I/O, and other operations that maximize the change in the current $I_{dd}$.

In addition, a "constant" process as described herein involves an algorithm that results in a relatively constant current $I_{dd}$, regardless of the magnitude of the current $I_{dd}$. In this respect, both the hot or cold processes as described above are also "constant" processes. Also, a constant process may be implemented that generates a current $I_{dd}$ that is neither high or low. Ultimately, a constant current is one in which the fluctuation of the current $I_{dd}$ is minimized to the extent practicable. Various processes that qualify as the hot, cold, aggressive, and constant process may be commercially available.

According to various embodiments of the present invention, any one of the hot, cold, aggressive, or constant processes may be executed in the die 109 from time to time to obtain measurement of current and voltage at various points as will be described. In addition, an alternating hot and cold process may be executed on the die 109 that results in an input current $I_{dd}$ at the power input 116 that mimics a periodic waveform. In this respect, an alternating hot and cold process is one that periodically alternates between the execution of a hot process and a cold process.

Figure 2:
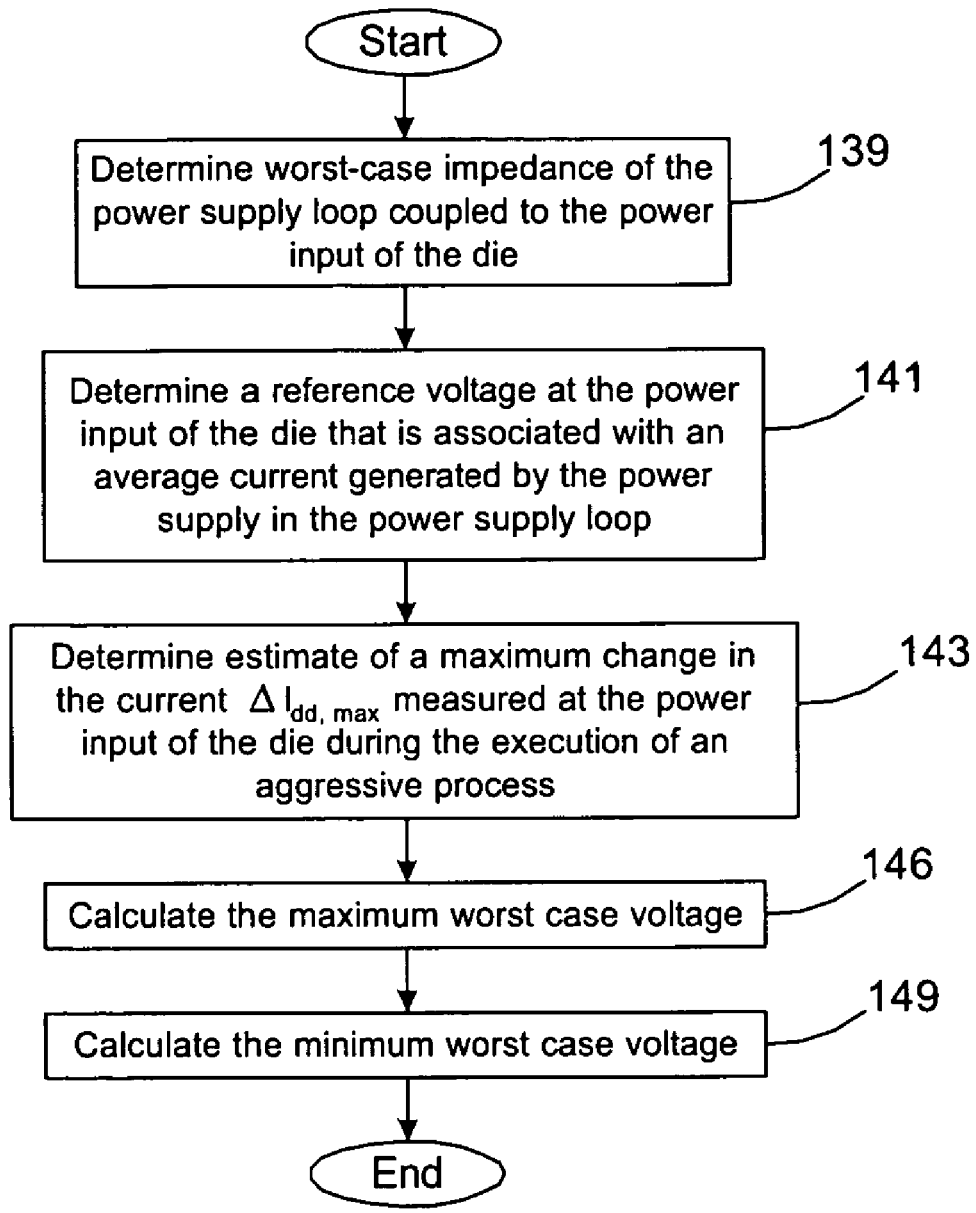
FIG. 2 is a flow chart of an example of one method for determining a worst-case voltage that is experienced at the power input of the die of FIG. 1 according to various embodiments of the present invention.

With reference to FIG. 2, shown is one example of a method for calculating a worst-case voltage experienced at the power input 116 (FIG. 1) of the die 109 (FIG. 1). Beginning with step 139, a worst-case impedance $R_w$ of the power supply loop that is coupled to the power input 116 of the die 109 is determined. The determination of the worst-case impedance $R_w$ involves several steps as will be described. Once the worst-case impedance $R_w$ is determined, then in step 141 a reference voltage $V_{REF}$ at the power input 116 of the die 109 is determined. In this respect, the reference voltage $V_{REF}$ is associated with an average current $I_{AVG}$ that is generated by the power supply 113 in the power supply loop during the execution of a constant process such as a hot process on the die 109 as will be described. A more detailed description of the determination of the reference voltage $V_{REF}$ is provided in the discussion that follows.

Once the reference voltage $V_{REF}$ has been determined, then the method proceeds to step 143 in which an estimate is determined of a maximum change in the current $I_{dd}$, denoted herein as $\Delta I_{dd, Max}$, that is experienced at the power input 116 of the die 109. In this respect, an aggressive process is executed on the die 109 that causes maximum fluctuation in the current $I_{dd}$ at the power input 116. A measure of the current $I_{dd}$ is derived from the measure of the voltage V(t) obtained during the execution of the aggressive process in the die 109 and a measure of the impedance $Z_f$ of the power supply loop. The estimate of the maximum change in the current $\Delta I_{dd, Max}$ is determined from the measure of the current $I_{dd}$ taken while the aggressive process is executed on the die 109. The aggressive process may be, for example, any one of a number of commercially available aggressive processes. Where a number of aggressive processes are available, one may determine the aggressive process that generates the greatest change in the current $I_{dd}$ by trial and error.

To obtain a measure of the current $I_{dd}$ from the measure of the voltage V(t), reference is made to co-pending U.S. patent application entitled "Measuring Current on a Die", filed on Dec. 22, 2003 and assigned Ser. No. 10/745,101, which is incorporated herein by reference. Alternatively, other approaches may be employed to obtain an adequate measure of the current $I_{dd}$ as is known by those with ordinary skill in the art.

Next, in step 146, the maximum worst-case voltage V experienced at the power input 116 is calculated as $$V_{wc,max} = V_{REF} + R_w(\Delta I_{dd,max}),$$

where $V_{REF}$ is the reference voltage, $R_w$ is the worst-case impedance, and $\Delta I_{dd,max}$, is the maximum change in the current $I_{dd}$ determined while running the aggressive process executed in step 143 above. Thereafter, in step 149 the minimum worst-case voltage is calculated as ti $V_{wc,min} = V_{REF} - R_w(\Delta I_{dd,max})$.

Thereafter, the method ends as shown.

Figure 3:
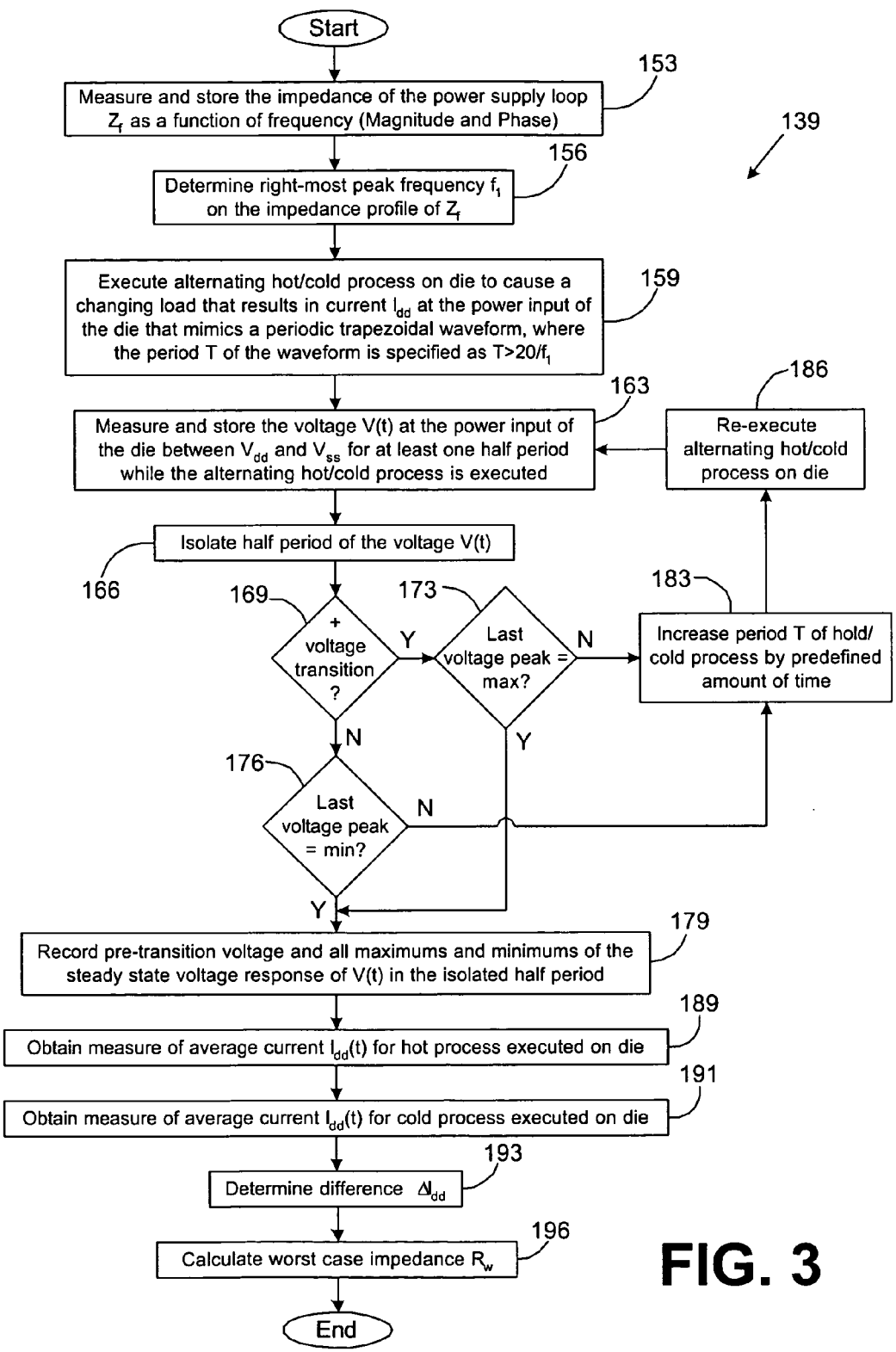
FIG. 3 is a flow chart of an example of one method for determining a worst-case impedance of the power supply loop coupled to the power input of the die of FIG. 1 according to an embodiment of the present invention.

With reference to FIG. 3, shown is a flow chart that illustrates one approach that may be taken to determine the worst-case impedance $R_w$ of the power supply loop coupled to the power input 116 as set forth in step 139 (FIG. 2) above according to an embodiment of the present invention. Beginning with step 153, first a measure is taken of the impedance of the power supply loop as a function of frequency, denoted herein as impedance $Z_f(\omega)$. In this respect, the impedance $Z_f(\omega)$ is determined as a function of frequency and is expressed in both magnitude and phase. In order to determine the impedance $Z_f(\omega)$, the approaches may be employed as described in U.S. patent application entitled "System and Method of Measuring Low Impedance" filed on Oct. 21, 2002 and assigned Ser. No. 10/274,611, and U.S. patent application entitled "System and Method of Measuring Well Impedances" filed on Oct. 21, 2002 and assigned Ser. No. 10/274,787, both of which are incorporated herein by reference. Alternatively, the impedance $Z_f(\omega)$ of the power supply loop may be ascertained using other approaches as can be appreciated with ordinary skill in the art.

Figure 4:
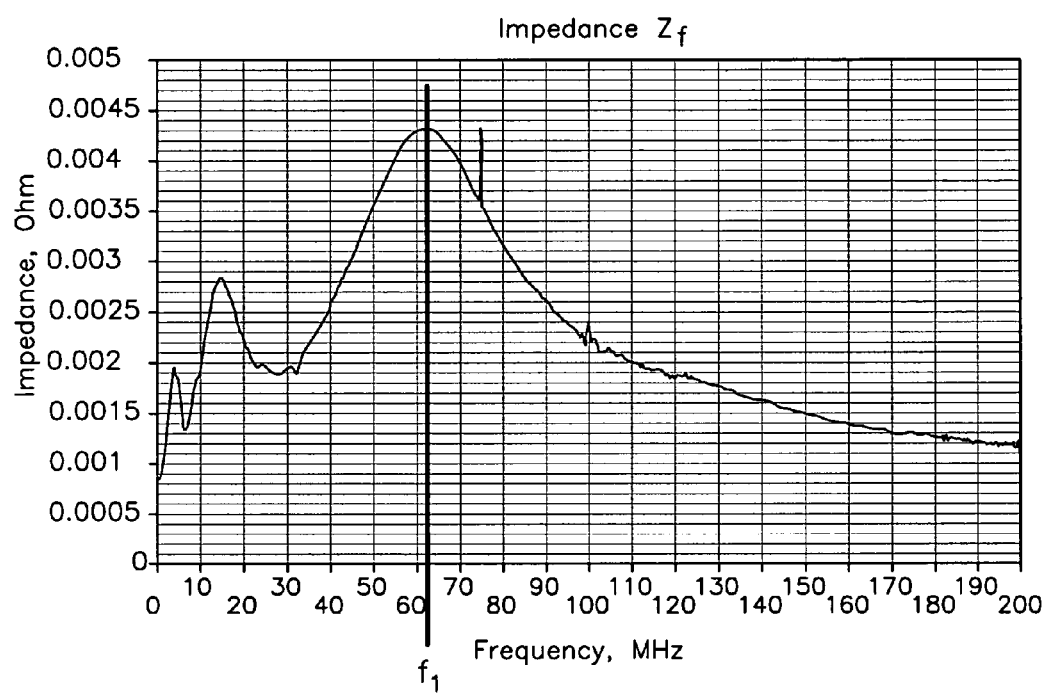
FIG. 4 is a graph of an impedance of a power supply loop on the circuit board of FIG. 1 as a function of frequency according to an embodiment of the present invention.

With reference to FIG. 4, shown is a graph that depicts an example of a measure of the impedance $Z_f(\omega)$ of the power supply loop as a function of frequency. Once a measure of the impedance $Z_f(\omega)$ of the power supply loop is obtained and stored in step 153, then in step 156 the frequency $f_1$ of the right-most peak corresponding to a resonance in the power supply loop is identified in the impedance profile of the impedance $Z_f(\omega)$ measured in box 153. In this respect, a number of resonances may exist in the frequency spectrum of the impedance $Z_f(\omega)$. However, the frequency of the right-most peak of resonance is selected. Note that peaks that are the result of noise such as, for example, those seen in ripples or other peaks resulting from noise are disregarded.

Referring back to FIG. 3, next in step 159, an alternating hot and cold process is executed on the die 109, thereby resulting in an alternating current $I_{dd}$ experienced at the power input 116 of the die 109 due to the periodic varying load presented by the alternating hot and cold process. In this regard, the current $I_{dd}$ (FIG. 1) experienced at the power input 116 of the die 109 mimics a periodic waveform. The alternating hot and cold process is configured such that the resulting periodic waveform has a period T that is specified as $T > A/f_1$, where A is approximately equal to 20. Alternatively, A may be greater or less than 20. In this respect, A is specified so as to make sure that a half-period of the periodic waveform is large enough so that all significant minimum and maximum voltages can be measured as will be described.

Then, in step 163, a measure is taken of the voltage V(t) at the power input 116 of the die 109 between $V_{dd}$ and $V_{ss}$ for at least one half-period of the periodic waveform while the alternating hot and cold process is executed on the die 109. In this respect, the voltage V(t) may approximate a periodic waveform. The measure of the voltage V(t) taken in step 163 is stored in an appropriate memory. Next, in step 166, a half-period of the measure of the voltage V(t) is isolated for further scrutiny. In this respect, the half-period may exist after a positive voltage transition in the periodic waveform or during a negative voltage transition in the periodic waveform. Next, in box 169, if it is determined that the half-period isolated in box 166 has occurred after a positive voltage transition, then the method proceeds to box 173. Otherwise, the present method proceeds to box 176.

Figure 5:
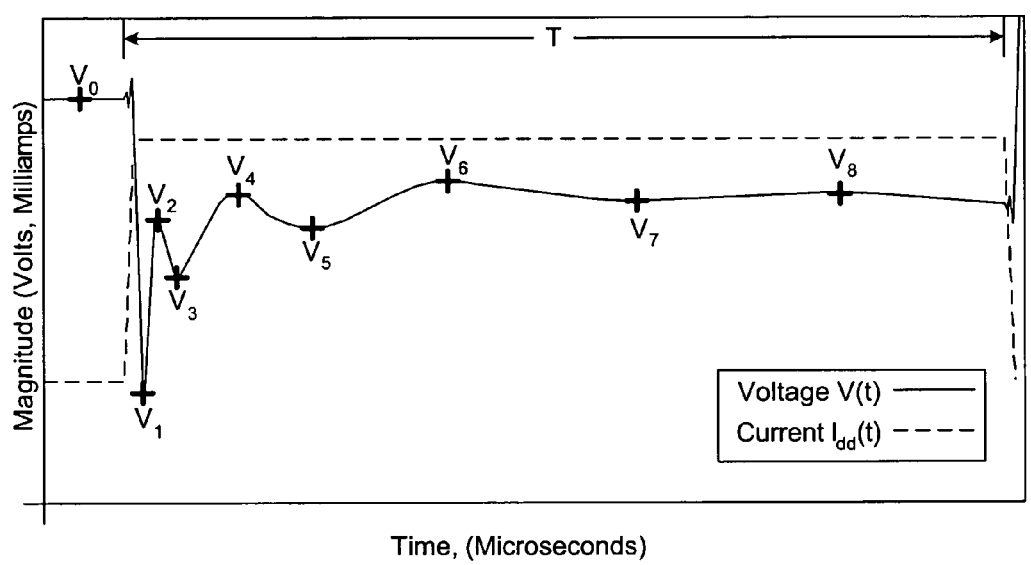
FIG. 5 is a graph of the voltage V(t) measured at the power input of the die of FIG. 1 during an execution of an alternating hot and cold process on the die according to an embodiment of the present invention.

To facilitate further discussion of the method described in FIG. 4, reference is made to FIG. 5 that shows a graph of a half-period of the periodic waveform of the current $I_{dd}(t)$ generated at the power input 116 of the die 109 by virtue of the execution of the alternating hot and cold process. In this respect, the current $I_{dd}(t)$ as shown is an ideal estimate of the actual current $I_{dd}(t)$ that may include a certain amount of noise and other fluctuation as can be appreciated with ordinary skill in the art.

Superimposed over the waveform showing the current $I_{dd}(t)$ is the voltage V(t) that illustrates the response of the voltage V(t) during the half cycle of the current $I_{dd}(t)$ while the alternating hot and cold process is executed on the die 109. The response of the voltage V(t) includes a number of significant maximum and minimum voltages $V_{1-N}$ as the voltage V(t) experiences oscillation in what is an underdamped response. The voltage $V_0$ is the voltage V(t) before the respective negative or positive transition of the current $I_{dd}(t)$. The voltages $V_{0-N}$ are ultimately measured and stored in order to be used to calculate the worst-case impedance $R_w$ as will be described.

Given that that the period T of the periodic waveform is approximately equal to 20 times the period of the right-most peak frequency $f_1$ on the impedance profile of $Z_f$ as described above, then all significant minimum and maximum voltages $V_{1-N}$ of the response of the voltage V(t) should appear within the half cycle, where the voltage $V_0$ appears just before the transition at the beginning of the half-cycle. In this respect, the voltage $V_0$ is defined herein as a pre-transition voltage. Thus, if a positive transition is experienced in the voltage V(t) at the beginning of the half-period, then the last measured voltage $V_N$ should be a maximum voltage. Correspondingly, if a negative voltage transition is experienced in the voltage V(t) at the beginning of the half-period, then the last measured voltage $V_N$ should be a minimum voltage. In any event, the total number of measured voltages $V_N$ should be an even number, where N is odd. The total number of measured voltages $V_N$ is specified so as to ensure that an adequate amount of information is obtained from the response of the voltage V(t) to provide for a meaningful estimate of the worst-case impedance $R_w$ as will be described. To the extent that an even number of measured voltages $V_N$ are not achieved, then the period T needs to be increased, where $T > A/f_1$.

Referring back to FIG. 4, assuming that the voltage transition before the half-period is a positive voltage transition, then in step 173 it is determined whether the last measured voltage $V_N$ of the response of the voltage V(t) during the half-period is a maximum voltage. If so, then the present method progresses to step 179. Otherwise, the present method proceeds to step 183.

Assuming that the last measured voltage $V_N$ identified in step 173, then in step 183 the period T of the alternating hot and cold process is increased by a predefined amount of time. In this respect, the half-period is extended so that the last measured voltage $V_N$ of the response of the voltage V(t) is a maximum voltage. Then, in step 186 the alternating hot and cold process is re-executed on the die 109 and the method reverts back to step 163 to obtain a new measure of the voltage V(t) that is then stored as described above.

With reference back to step 169, if the transition of the voltage V(t) before the half-period is a negative voltage transition, then the method proceeds to step 176 in which it is determined whether the last measured voltage $V_N$ of the response of the voltage V(t) is a minimum voltage. If not, then the method reverts to step 183 as shown. Otherwise, the method proceeds to step 179. In this respect, whether a positive or negative transition in the voltage V(t) before the half-period occurs, the last measured voltage $V_N$ should be a maximum or minimum that matches the transition or the period T needs to be increased.

In step 179, the pre-transition voltage $V_0$ and all of the maximums and minimums of the voltage response of the voltage V(t) that occur in the isolated half-period of the periodic waveform of the current $I_{dd}(t)$ resulting from the alternating hot and cold process are identified and stored in a memory for further use. Then, in step 189, a measure of the average current $I_{dd}$ experienced at the power input 116 of the die 109 is obtained while a hot process is executed in the die 109. This average current is denoted as current $I_{dd, Hot}$. This step may involve, for example, averaging of samples of the current $I_{dd}$ measured over a period of time to obtain the average current $I_{dd}$ to further minimize any fluctuation that may be experienced. Next, in box 191, a measure of the average current $I_{dd}$ experienced at the power input 116 of the die 109 is obtained while a cold process is executed in the die 109. This average current is denoted herein as current $I_{dd, Cold}$. This step may involve, for example, averaging of samples of the current $I_{dd}$ measured over a period of time to obtain the average current $I_{dd}$ to further minimize any fluctuation that may be experienced. Then, in step 193, the difference in the current $I_{dd}$, between the current $I_{dd, Hot}$ and $I_{dd, Cold}$, denoted herein as $\Delta I_{dd}$, is determined.

Next, in box 196, the worst-case impedance $R_w$ is calculated using the pre-transition voltage $V_0$ which is the voltage V before the transition at the beginning of the half-period, the recorded maximum and minimum voltages $V_{1-N}$ of the response of the voltage V(t) in the isolated half-period, and the estimate of the change in the current $\Delta I_{dd}$ at the power input 116 of the die 109 according to the following equation $$R_w = \frac{\sum_{i=0}^{M} |V_{2i} - V_{2i+1}|}{\Delta I_{dd}}.$$

where M is equal to (N+1)/2, where N is the total number of measured voltages $V_{0-N}$. Thereafter, the method for determining the worst-case impedance $R_w$ ends as shown.

Figure 6:
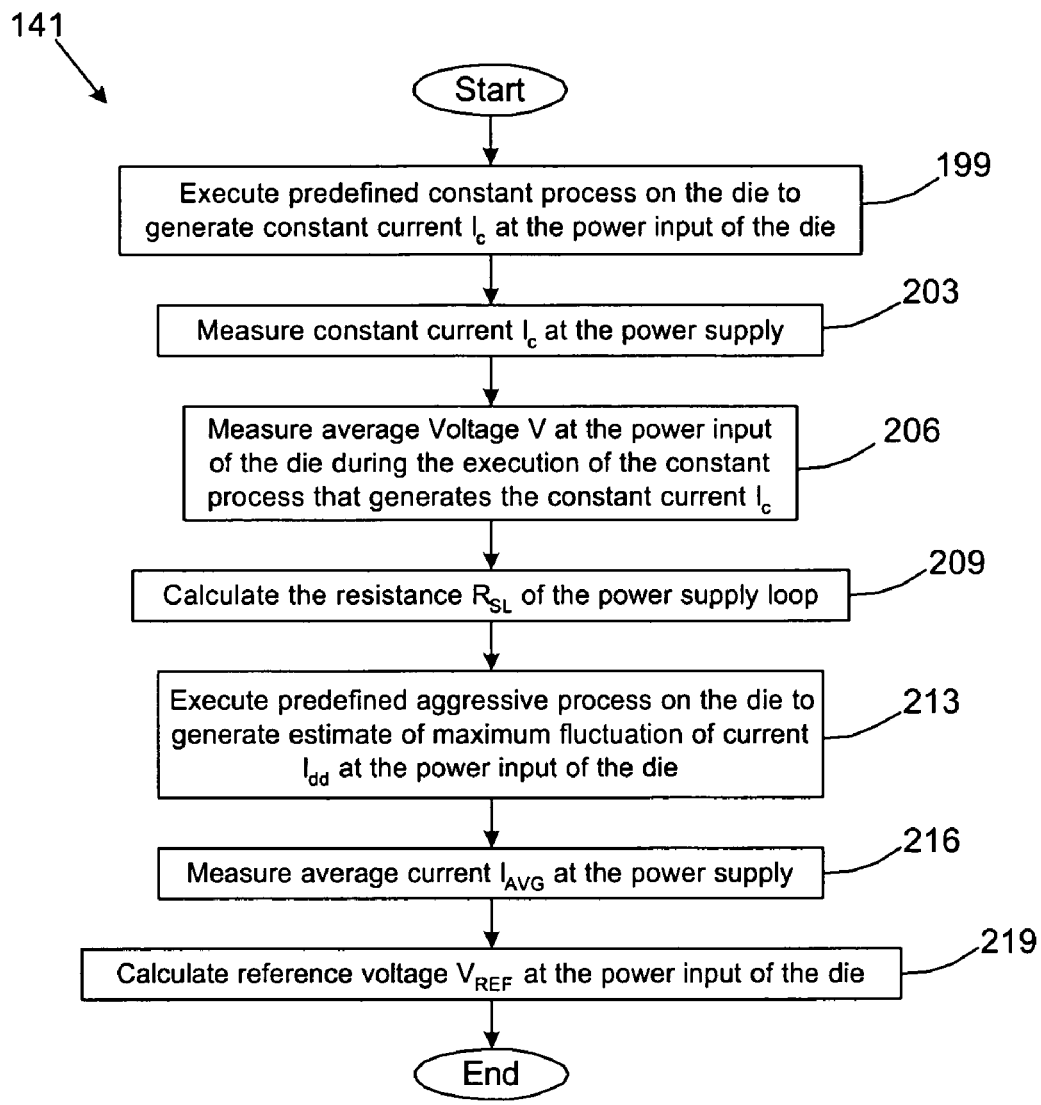
FIG. 6 is a flow chart of an example of one method for determining a reference voltage at the power input of the die of FIG. 1 according to an embodiment of the present invention.

With reference to FIG. 6, shown is a flow chart that illustrates an example of the steps taken to determine the reference voltage in step 141 of FIG. 2 described above according to an embodiment of the present invention. To begin, in step 199, a constant process is executed on the die 109 that results in the generation of a constant current $I_c$ at the power input 116 (FIG. 1) of the die 109 (FIG. 1). Next, in step 203 the constant current $I_c$ is measured at the power supply 113. In order to measure the current $I_c$ at the power supply 113 (FIG. 1), various approaches may be employed, including, for example, measuring a voltage drop across a known resistance and calculating the current therefrom or some other approach may be employed.

Thereafter, in step 206, the voltage V(t) at the power input 116 of the die 109 is measured during the execution of the constant process that generates the constant current $I_C$. The measure of the voltage V(t) is stored for future use as will be described.

Next, in step 209, the resistance $R_{SL}$ of the power supply loop coupled to the power input 116 of the die 109 is calculated. In this respect, the voltage generated by the power supply 113 denoted herein as $V_{Supply}$ is known, the voltage at the power input 116 is known, and the current $I_c$ is known. Consequently, the resistance $R_{SL}$ of the power supply loop is calculated as $$R_{SL} = \frac{(V_{Supply} - V)}{I_c},$$

where $V_{Supply}$ is the voltage generated by the power supply 113.

Next, in step 213 an aggressive process is executed on the die 109 to generate the current $I_{dd}$ that experiences significant fluctuation or change at the power input 116 of the die 109.

Then, in step 216, the average current $I_{AVG}$ is measured at the power supply 113 while the aggressive process is executed as was discussed in step 213. In this respect, the current is measured at the power supply 113 and the resulting samples of current are averaged over time to obtain the average current $I_{AVG}$.

Next, in box 219, the reference voltage $V_{REF}$ at the power input 116 of the die 109 is calculated according to the following equation $$V_{REF} = V_{Supply} - I_{AVG}(R_{SL}),$$

where $V_{Supply}$ is the voltage generated at the power supply 113. Thereafter, the method for determining the reference voltage $V_{REF}$ ends as shown.

In addition, it is understood that while the steps of the method depicted in the flow charts of FIGS. 2, 3, and 5 appear in a predefined order, it is understood that the order of the steps may vary from that depicted.

Figure 7:
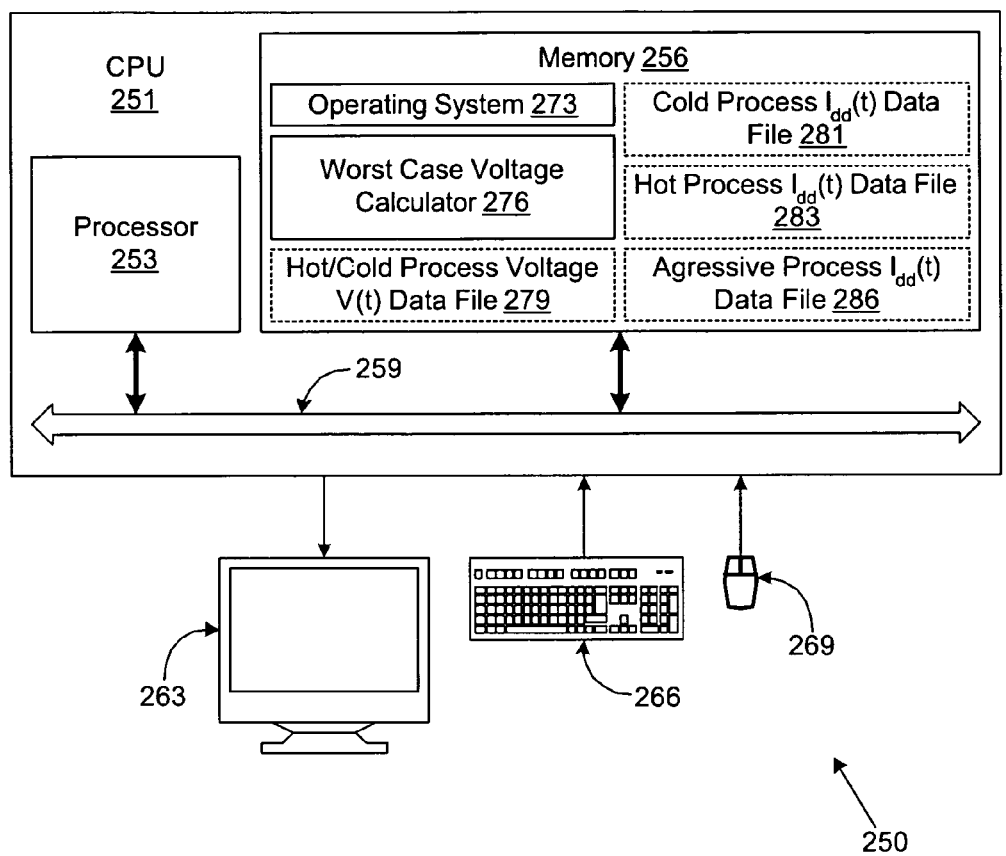
FIG. 7 is a schematic block diagram of an example of a computer system that is employed to execute a worst-case voltage calculator to determine an estimate the worst-case impedance and the worst-case voltage experienced at the power input of the die of FIG. 1 according to an embodiment of the present invention.

With reference to FIG. 7, shown is a block diagram of a computer system 250 according to an embodiment of the present invention. In this respect, the computer system 250 may be, for example, a desktop, laptop, personal digital assistant, or other type of system with like capability as can be appreciated with those with ordinary skill in the art.

The computer system 250 includes a central processing unit 251 that includes a processor circuit having a processor 253 and a memory 256, both of which are coupled to a local interface 259. In this respect, the local interface 259 may comprise, for example, a data bus with an accompanying control/address bus as can be appreciated by those with ordinary skill in the art. In addition, the computer system 250 may include a display device 263, a keyboard 266, and a mouse 269. In addition, the computer system 250 may include other peripheral devices such as, for example, keypad, touch pad, touch screen, microphone, scanner, joystick, or one or more push buttons, etc. The peripheral devices may also include additional display devices, indicator lights, speakers, printers, etc. The display device 263 may be, for example, a cathode ray tube (CRT), liquid crystal display screen, gas plasma-based flat panel display, or other type of display device, etc.

Stored on the memory 256 and executable by the processor 253 are an operating system 273 and a worst-case voltage calculator 276. In addition, other applications and processes may be stored in the memory 256 and executed by the processor 253 as can be appreciated. A number of data files are stored in the memory 256 and are accessed and/or manipulated by the worst-case voltage calculator 276. These data files include, for example, a hot/cold process voltage V(t) data file 279, a cold process $I_{dd}(t)$ data file 281, a hot process $I_{dd}(t)$ data file 283, and an aggressive process $I_{dd}(t)$ data file 286. The data files 279, 281, 283, 286 are accessed by the worst-case voltage calculator 276 as is appropriate to calculate a worst-case impedance $R_w$ and the worst-case voltage V(t) as will be described.

As contemplated herein, the term "executable" means a program file that is in a form that can run by the processor or transformed into a format that can ultimately be run by the processor 253. Examples of executable programs may be, for example, a compiled program that can be translated into machine code in a format that can be loaded into a random access portion of the memory 256 and run by the processor 253, or source code that may be expressed in proper format such as object code that is capable of being loaded into a of random access portion of the memory 256 and executed by the processor 253, etc. An executable program may be stored in any portion or component of the memory 256 including, for example, random access memory, read-only memory, a hard drive, compact disk (CD), floppy disk, or other memory components.

The memory 256 is defined herein as both volatile and nonvolatile memory and data storage components. Volatile components are those that do not retain data values upon loss of power. Nonvolatile components are those that retain data upon a loss of power. Thus, the memory 256 may comprise, for example, random access memory (RAM), read-only memory (ROM), hard disk drives, floppy disks accessed via an associated floppy disk drive, compact discs accessed via a compact disc drive, magnetic tapes accessed via an appropriate tape drive, and/or other memory components, or a combination of any two or more of these memory components. In addition, the RAM may comprise, for example, static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or other like memory device.

In addition, the processor 253 may represent multiple processors and the memory 256 may represent multiple memories that operate in parallel. In such a case, the local interface 259 may be an appropriate network that facilitates communication between any two of the multiple processors, between any processor and any one of the memories, or between any two of the memories etc. The processor 253 may be of electrical, optical, or molecular construction, or of some other construction as can be appreciated by those with ordinary skill in the art.

The operating system 273 is executed to control the allocation and usage of hardware resources such as the memory, processing time and peripheral devices in the computer system 250. In this manner, the operating system 273 serves as the foundation on which applications depend as is generally known by those with ordinary skill in the art.

Figure 8:
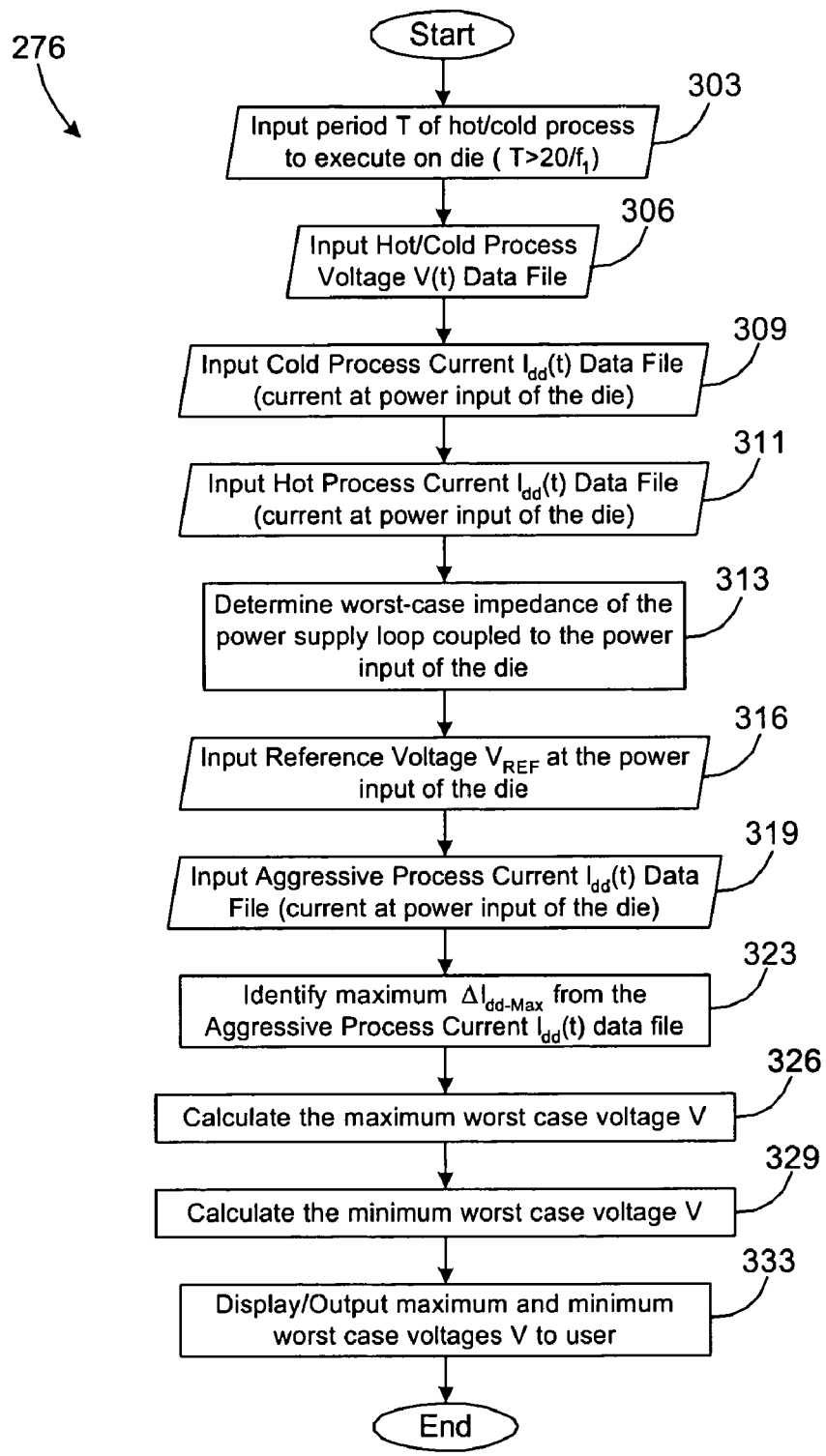
FIG. 8 is a flow chart that provides one example of the operation of the worst-case voltage calculator executed in the computer system of FIG. 7 according to an embodiment of the present invention.

Referring next to FIG. 8, shown is a flow chart that provides one example of the operation of the worst-case voltage calculator 276 according to an embodiment of the present invention. Alternatively, the flow chart of FIG. 8 may be viewed as depicting steps of an example of a method implemented in the computer system 100 to determine a worst-case impedance $R_w$ and a worst-case voltage V. The functionality of the worst-case voltage calculator 276 as depicted by the example flow chart of FIG. 8 may be implemented, for example, in an object oriented design or in some other programming architecture. Assuming the functionality is implemented in an object oriented design, then each block represents functionality that may be implemented in one or more methods that are encapsulated in one or more objects. The worst-case voltage calculator 276 may be implemented using any one of a number of programming languages such as, for example, C, C++, Assembly Language, or other programming languages.

Beginning with box 303, the period T (FIG. 5) of the alternating hot and cold process that is executed on the die 109 (FIG. 1) as illustrated in FIG. 5 above is input by the worst-case voltage calculator 276. To input the period T, the worst-case voltage calculator 276 may generate an appropriate user interface on the display device 263, for example, that facilitates a user input of the period T using input devices such as the keyboard 266 (FIG. 7) or the mouse 269 (FIG. 7). Similarly, the worst-case voltage calculator 276 may generate other user interfaces on the display device 263 that may facilitate a user input of other information and data files that are employed by the worst-case voltage calculator 276 as will be described.

Next, in box 306, the worst-case voltage calculator 276 inputs the hot and cold process voltage V(t) data file 279 (FIG. 7) for use in calculation to follow. In this respect, the hot and cold process voltage process V(t) data file 279 includes data that represents the voltage V(t) that approximates a periodic waveform as described above with reference to FIG. 5. The hot and cold process voltage V(t) data file 279 is generated during the execution of the alternating hot and cold process on the die 109 as described above. To input the hot and cold process voltage V(t) data file 279, a user may manipulate an appropriate interface on the display device 263 to specify a position in the memory 256 of the data file itself using a browse function for access by the worst-case voltage calculator 276.

Thereafter, in box 309, the worst-case voltage calculator 276 inputs the cold process current $I_{dd}(t)$ data file 281 for future manipulation. Then, in box 311, the worst-case voltage calculator 276 inputs the hot process current $I_{dd}(t)$ data file 283. The inputting of the hot and cold process current $I_{dd}(t)$ data files 281 and 283 is performed in a manner similar to the hot and cold process voltage V(t) data file 279 discussed above. The hot and cold process $I_{dd}(t)$ data files 281 and 283 each include data that represents the current at the power input 116 of the die 109 during the execution of the hot process and the cold process on the die 109, respectively, as was described with reference to the method of FIG. 4.

Thereafter, in box 313, the worst-case voltage calculator 276 determines a worst-case impedance $R_w$ of the power supply loop coupled to the power input 116 (FIG. 1) of the die 109. An example of specific functionality executed to determine the worst-case impedance $R_w$ described in box 313 will be described with reference to FIG. 9. Next, in box 316, the worst-case voltage calculator 276 inputs the aggressive process current $I_{dd}(t)$ data file 286 (FIG. 7) that includes data that represents the current $I_{dd}$ at the power input 116 of the die 109 while the aggressive process is executed on the die 109 as described with regard to the method of FIG. 2 above.

Next, in box 319, a reference voltage $V_{REF}$ is input into the worst-case voltage calculator 276. In this respect, the reference voltage $V_{REF}$ may be determined as was described with reference to FIG. 6 or using some other approach. Next, in box 323, an estimate of a maximum change in the current $I_{dd}$, denoted herein as the change of current $\Delta I_{dd, Max}$, is determined from the aggressive process current $I_{dd}(t)$ data file 286. In this respect, the maximum change in the current $\Delta I_{dd, Max}$ is determined from the aggressive process current $I_{dd}(t)$ data file 286 that includes data that embodies the current $I_{dd}(t)$ measured as the aggressive process is executed on the die 109. In this respect, the aggressive process current $I_{dd}(t)$ data file 286 provides the best estimate of the current $I_{dd}(t)$ from which the maximum change in the current $\Delta I_{dd, Max}$ may be determined in box 323. In this respect, the maximum change in the current $\Delta I_{dd, Max}$ may be determined by measuring the magnitude of the difference between the highest and lowest current in the current $I_{dd}(t)$.

Next, in box 326, the worst-case voltage calculator 276 calculates an estimate of the maximum worst-case voltage V as $$V_{wc,max} = V_{REF} + R_w(\Delta I_{dd,Max}),$$

where $V_{REF}$ is the reference voltage, $R_w$ is the worst-case impedance, and $\Delta I_{dd,max}$, is the maximum change in the current $I_{dd}(t)$ determined from the aggressive process current $I_{dd}(t)$ data file 286 Thereafter, in box 329, an estimate of the minimum worst-case voltage V is calculated as $$V_{wc,min} = V_{REF} - R_w(\Delta I_{dd,Max}).$$

In this respect, the calculation of the estimates of the maximum worst-case voltage $V_{wc, Max}$ and the minimum worst-case voltages $V_{wc, Min}$ is thus based upon a number of factors including the worst-case impedance $R_w$, the estimated maximum change in the current $\Delta I_{dd, Max}$ at the power input 116 of the die 109, and the reference voltage $V_{REF}$ at the power input of the die 109. In this respect, the reference voltage $V_{REF}$ is associated with the average current $I_{AVG}$ generated at the power supply 113 (FIG. 1).

Next, in box 333, the worst-case voltage calculator 276 renders the maximum worst-case voltage $V_{wc, max}$ and the minimum worst-case voltages $V_{wc, min}$ to the user, for example, by display on the display device 263 in an appropriate user interface, by printing on an appropriate print medium using a printer, or by using some other approach, etc. Thereafter, the worst-case voltage calculator 276 ends as shown.

Figure 9:
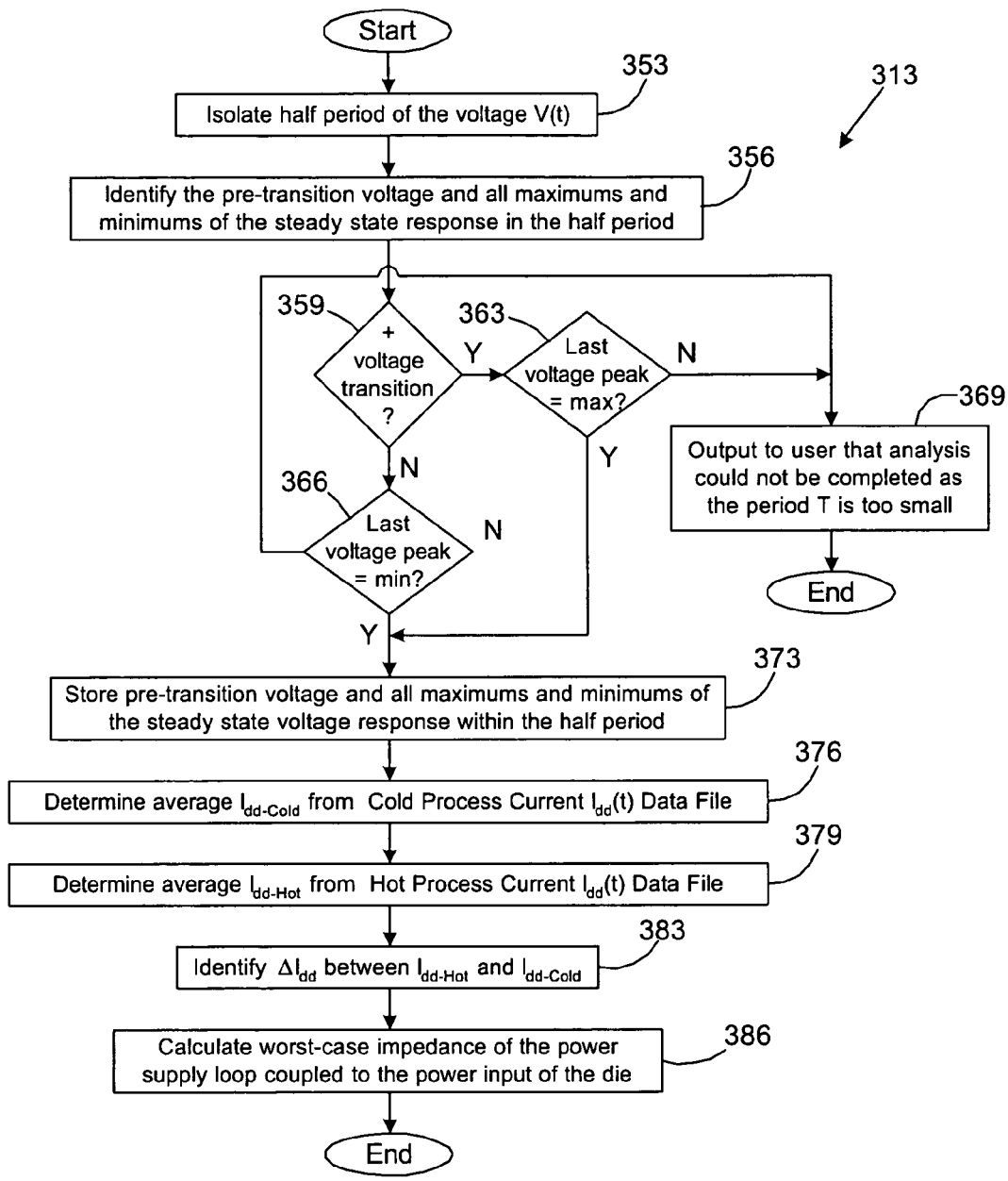
FIG. 9 is a flow chart that further illustrates the example of the operation of the worst-case voltage calculator executed in the computer system of FIG. 7 according to an embodiment of the present invention.

Referring next to FIG. 9, shown is a flow chart that provides one example of the operation of a portion of the worst-case voltage calculator 276 in determining the worst-case impedance $R_w$ of the power supply loop coupled to the power input 116 (FIG. 1) of the die 109 (FIG. 1) according to an embodiment of the present invention. Alternatively, the flow chart of FIG. 9 may be viewed as depicting steps of an example of a method implemented in the computer system 250 to determine the worst-case impedance $R_w$ of the power supply loop coupled to the power input 116 (FIG. 1) of the die 109 (FIG. 1). The functionality of the portion of the worst-case voltage calculator 276 as depicted by the example flow chart of FIG. 9 may be implemented, for example, in an object oriented design or in some other programming architecture. Assuming the functionality is implemented in an object oriented design, then each block represents functionality that may be implemented in one or more methods that are encapsulated in one or more objects. The portion of the worst-case voltage calculator 276 described in FIG. 9 may be implemented using any one of a number of programming languages such as, for example, C, C++, Assembler, or other programming languages.

Beginning with box 353, the worst-case voltage calculator 276 isolates a half-period of a voltage V(t) expressed in the hot and cold process voltage V(t) data file 279 to be examined to obtain the pre-transition voltage $V_0$ and the minimum and maximum voltages $V_{1-N}$ for the response of the voltage V(t). Thereafter, in box 356 the pre-transition voltage $V_0$ and all maximum and minimum voltages $V_{1-N}$ of the response of the voltage V(t) in the half-period are identified. The pre-transition voltage $V_0$ and the maximum and minimum voltages $V_{1-N}$ are identified in the voltage V(t) as was described with reference to FIG. 5 above.

Thereafter, in box 359, the worst-case voltage calculator 276 determines whether the voltage transition at the beginning of the half-period of the voltage V(t) is a positive voltage transition. If so, then the worst-case voltage calculator 276 proceeds to box 363. Otherwise, the worst-case voltage calculator 276 progresses to box 366. This determination may be made, for example, by comparing the magnitude of the voltage V(t) near the end of the half-period with the magnitude of the voltage V(t) just before the transition. If the change in the voltage V(t) between these two points is positive, then the transition is a positive transition. If the change is negative, then the transition is a negative transition.

Assuming the transition to be positive, then in box 366 the worst-case voltage calculator 276 determines whether the last measured voltage $V_N$ of the response of the voltage V(t) is a maximum. If not, then the worst-case voltage calculator 276 proceeds to box 369. Otherwise, the worst-case voltage calculator 276 progresses to box 373. In box 369, an appropriate message is displayed to the user or otherwise rendered for the user that informs the user that the analysis could not be completed as the period T (FIG. 5) of the periodic waveform presented by the hot and cold process executed on the die 109 is too small. Thereafter, the worst-case voltage calculator 276 ends.

Assuming that the transition is determined to be a negative voltage transition in box 359, then in box 366, the worst-case voltage calculator 276 determines whether the last measured voltage $V_N$ in the response of the voltage V(t) in the half-period is a minimum. If so then the worst-case voltage calculator 276 proceeds to box 373. Otherwise, the worst-case voltage calculator 276 reverts to box 369 as shown.

In box 373, the pre-transition voltage $V_0$ and all maximum voltages and minimum voltages of the response of the voltage V(t) within the half-period are stored in the memory 256. Thereafter, in box 376 the worst-case voltage calculator 276 determines the average current $I_{dd-Cold}$ from the cold process current $I_{dd}(t)$ data file 281 by averaging a number of samples of the cold process current $I_{dd}(t)$ data file 281 over time. Similarly, in box 279, the worst-case voltage calculator 276 determines the average current $I_{dd-Hot}$ from the hot process current $I_{dd}(t)$ data file 283 by averaging a number of samples of the cold process current $I_{dd}(t)$ data file 283 over time. The averaging functions performed in box 276 and 279 server to further minimize any fluctuation in the hot and cold process current $I_{dd}(t)$. Then, in box 383, the difference between the hot and cold average currents $I_{dd-Hot}$ and $I_{dd-Cold}$, denoted as current $\Delta I_{dd}$, is calculated. Thereafter, in box 386, the worst-case impedance $R_w$ of the power supply loop that is coupled to the power input 116 of the die 109 is calculated from the pre-transition voltage, the maximum voltages and the minimum voltages of the response of the voltage V(t), and the estimate of the change in the current $\Delta I_{dd}$ at the power input 116 of the die 109. In this respect, the calculation of the worst-case impedance $R_w$ may be performed using the following equation $$R_w = \frac{\sum_{i=0}^{M} |V_{2i} - V_{2i+1}|}{\Delta I_{dd}},$$

where $R_w$ is the worst-case impedance, M is equal to (N+1)/2, where N is the total number of measured voltages $V_{0-N}$, $V_x$ is the magnitude of the respective measured voltages of the response, and $\Delta I_{dd}$ is the estimate of the change in the current at the power input of the die. Thereafter, the portion of the worst-case voltage calculator 276 that determines the worst-case impedance $R_w$ ends as shown.

Although the worst-case voltage calculator 276 is embodied in software or code executed by general purpose hardware as discussed above, as an alternative it may also be embodied in dedicated hardware or a combination of software/general purpose hardware and dedicated hardware. If embodied in dedicated hardware, the worst-case voltage calculator 276 can be implemented as a circuit or state machine that employs any one of or a combination of a number of technologies. These technologies may include, but are not limited to, discrete logic circuits having logic gates for implementing various logic functions upon an application of one or more data signals, application specific integrated circuits having appropriate logic gates, programmable gate arrays (PGA), field programmable gate arrays (FPGA), or other components, etc. Such technologies are generally well known by those skilled in the art and, consequently, are not described in detail herein.

The flow charts of FIGS. 8 and 9 show the architecture, functionality, and operation of an implementation of the worst-case voltage calculator 276. If embodied in software, each block may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processor in a computer system or other system. The machine code may be converted from the source code, etc. If embodied in hardware, each block may represent a circuit or a number of interconnected circuits to implement the specified logical function(s).

Although the flow charts of FIGS. 8 and 9 show a specific order of execution, it is understood that the order of execution may differ from that which is depicted. For example, the order of execution of two or more blocks may be scrambled relative to the order shown. Also, two or more blocks shown in succession in FIGS. 8 and 9 may be executed concurrently or with partial concurrence. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present invention.

Also, where the worst-case voltage calculator 276 comprises software or code, it can be embodied in any computer-readable medium for use by or in connection with an instruction execution system such as, for example, a processor in a computer system or other system. In this sense, the logic may comprise, for example, statements including instructions and declarations that can be fetched from the computer-readable medium and executed by the instruction execution system. In the context of the present invention, a "computer-readable medium" can be any medium that can contain, store, or maintain the worst-case voltage calculator 276 for use by or in connection with the instruction execution system. The computer readable medium can comprise any one of many physical media such as, for example, electronic, magnetic, optical, electromagnetic, infrared, or semiconductor media. More specific examples of a suitable computer-readable medium would include, but are not limited to, magnetic tapes, magnetic floppy diskettes, magnetic hard drives, or compact discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

Although the invention is shown and described with respect to certain embodiments, it is obvious that equivalents and modifications will occur to others skilled in the art upon the reading and understanding of the specification. The present invention includes all such equivalents and modifications, and is limited only by the scope of the claims.

What is claimed is:

1. A method, comprising:
    determining a worst-case impedance of a power supply loop coupled to a power input of a die by measuring a voltage V(t) at the power input of the die while executing an alternating hot and cold process on the die, wherein the alternating hot and cold process generates a current at the power input of the die that approximates a periodic waveform;
    storing the voltage V(t) in a memory;
    determining a reference voltage at the power input of the die associated with an average current generated at a power supply included in the power supply loop;
    measuring a maximum change in a current at the power input of the die; and
    calculating an estimate of a worst-case voltage at to power input of the die based upon the worst-case impedance, the reference voltage, and the maximum change in the current.

2. The method of claim 1, wherein the determining of the worst-case impedance of the power supply loop coupled to the power input of the die further comprises identifying a pre-transition voltage before a half-period of the voltage V(t), and a number of maximum voltages and a number of minimum voltages of a response of the voltage V(t) within the half-period of the voltage V(t).

3. The method of claim 2, wherein the determining of the worst-case impedance of the power supply loop coupled to the power input of the die further comprises determining a period of the alternating hot and cold process to be at least as great as $X/f_1$, where $f_1$ is defined as a frequency of a right-most peak corresponding to a resonance in the power supply loop as depicted in a graph of the impedance of the power supply loop as a function of frequency, and X is specified so as to include the maximum voltages and the minimum voltages within the half-period of the voltage V(t), wherein the maximum and minimum voltages comprise all significant maximum voltages and all significant minimum voltages of the response of the voltage V(t).

4. The method of claim 2, wherein the determining of the worst-case impedance of the power supply loop coupled to the power input of the die further comprises:
measuring a first current at the power input of the die during the execution of a hot process on the die;
measuring a second current at the power input of the die during the execution of a cold process on the die;
determining a difference between the first and second currents; and
calculating the worst-case impedance from the pre-transition voltage, the maximum voltages and minimum voltages of the response of the voltage V(t), and the difference between the first and second currents at the power input of the die.

5. The method of claim 4, wherein the calculating of the worst-case impedance from the pre-transition voltage, the maximum voltages and the minimum voltages of the response of the voltage V(t), and the difference between the first and second currents in the current at the power input of the die further comprises calculating the worst-case impedance using the equation $$R_w = \frac{\sum_{i=0}^{M}|V_{2i} - V_{2i+1}|}{\Delta I_{dd}},$$

where $R_w$ is the worst-case impedance, M is the total number of pairs of measured voltages including the pre-transition voltage, the maximum voltages, and the minimum voltages of the response, $V_x$ is the magnitude of the respective maximum and minimum voltages of the response, and $\Delta I_{dd}$ is the difference between the first and second currents at the power input of the die.

6. The method of claim 1, wherein the determining of the reference voltage at the power input of the die associated with an average current generated at the power supply included in the power supply loop further comprises:
determining a resistance of the power supply loop;
determining an average current at a power supply of the power supply loop; and
calculating the reference voltage at the power input of the die based upon the resistance of the power supply loop, the average current, and a voltage generated by a power supply in the power supply loop.

7. The method of claim 6, wherein the determining of the resistance of the power supply loop further comprises:
generating a constant current at the power input of the die by executing a constant process on the die;
measuring the constant current;
measuring the voltage at the power input of the die while the constant process is executed; and
calculating the resistance of the power supply loop bused upon the voltage at the power input of the die, the constant current, and the voltage generated by a power supply in the power supply loop.

8. The method of claim 6, wherein the determining of the average current at the power supply of power supply loop further comprises:
executing an aggressive process on the die;
measuring a current at the power supply while the aggressive process is executed on the die; and
determining the average current from the current measured at the power supply while the aggressive process was executed on the die.

9. The method of claim 1, wherein the measuring of the maximum change in the current at the power input of the die further comprises:
executing an aggressive process on the die; and
measuring and storing the current at the power input of the die as a function of time.

10. The method of claim 1, wherein the calculating of the estimate of the worst-case voltage at the power input of the die further comprises calculating an estimate of a maximum worst-case voltage.

11. The method of claim 1, wherein the calculating of the estimate of the worst-case voltage at the power input of the die further comprises calculating an estimate of a minimum worst-case voltage.

12. A computer program embodied in a computer readable medium, comprising:
code that determines a worst-case impedance of a power supply loop coupled to a power input of a die;
code that calculates an estimate of the worst-case voltage at the power input of the die based upon a number of factors, including:
the worst-case impedance;
an estimated maximum change in a current at the power input of the die; and
a reference voltage at the power input of the die, the reference voltage being associated with an average current generated at a power supply included in the power supply loop; and
code that inputs a data file that embodies a measure of a voltage V(t) at the power input of the die while executing an alternating hot and cold process on the die, wherein the alternating hot and cold process generates a current at the power input of the die that approximates a periodic waveform.

13. The computer program embodied in the computer readable medium of claim 12, wherein the code that determines the worst-case impedance of the power supply loop coupled to the power input of the die further comprises code that identifies a pre-transition voltage before a half-period of the periodic waveform and a number of maximum voltages and minimum voltages of the response of the voltage V(t) within the half-period.

14. The computer program embodied in the computer readable medium of claim 13, wherein the code that determines the worst-case impedance of the power supply loop coupled to the power input of the die further comprises:
code that determines a difference between a first current measured at the power input during the execution of a hot process on the die and a second current measured at the power input during the execution of a cold process on the die; and code that calculates the worst-case impedance from the pro-transition voltage, the maximum voltages, and the minimum voltages of the response of the voltage V(t) and the difference between the first current and the second current.

15. The computer program embodied in the computer readable medium of claim 14, wherein code that calculates the worst-case impedance from the pre-transition voltage, the maximum voltages, and the minimum voltages of the response of the voltage V(t) and the difference between the first current end the second current further comprises code that calculates the worst-case impedance using the equation $$R_w = \frac{\sum_{i=0}^{M} |V_{2i} - V_{2i+1}|}{\Delta I_{dd}},$$

where $R_w$ is the worst-case impedance, M is the total number of pairs of measured voltages including the pro-transition voltage and the maximum and minimum voltages of the response, $V_x$ is the magnitude of the respective maximum and minimum voltages of the response, and $\alpha I_{dd}$ is the difference between the first current and the second current at the power input of the die.

16. The computer program embodied in the computer readable medium of claim 12, wherein the code that calculates the estimate of the worst-case voltage at the power input of the die further comprises code that calculates an estimate of a maximum worst-case voltage.

17. The computer program embodied in the computer readable medium of claim 12, wherein the code that calculates the estimate of the worst-case voltage at the power input of the die further comprises code that calculates an estimate of a minimum worst-cue voltage.

18. A system for determination of a worst-case voltage, comprising:
a processor circuit having a processor and a memory;
a worst-case voltage calculator stored in the memory and executable by the processor, the worst-case voltage calculator comprising:
logic that determines a worst-case impedance of a power supply loop coupled to a power input of a die; and
logic that calculates an estimate of the worst-case voltage at the power input of the die based upon a number of factors, including:
the worst-case impedance;
an estimated maximum change in a current at the power input of the die; and
a reference voltage, at the power input of the die, the reference voltage being associated with an average current generated at a power supply included in the power supply loop, wherein the logic that determines the worst-case impedance of the power supply loop coupled to the power input of the die further comprises logic that inputs a data file that embodies a measure of a voltage V(t) at the power input of the die while executing an alternating hot and cold process on the die, wherein the alternating hot and cold process generates a current at the power input of the die that approximates a periodic waveform.

19. The system of claim 18, wherein the logic that determines the worst-case impedance of the power supply loop coupled to the power input of the die further comprises logic that identifies a pro-transition voltage before a half-period of the periodic waveform, and a number of maximum voltages and minimum voltages of the response of the voltage V(t) within the half-period of the periodic waveform.

20. The system of claim 19, wherein the logic that determines the worst-case impedance of the power supply loop coupled to the power input of the die further comprises:
logic that determines a difference between a first current measured at the power input during the execution of a hot process on the die and a second current measured at the power input during the execution of a cold process on the die; and
logic that calculates the worst-case impedance from the pre-transition voltage, the maximum voltages, and the minimum voltages of the response of the voltage V(t), and the difference between the first current and the second current.

21. The system of claim 20, wherein logic that calculates the worst-case impedance from the pre-transition voltage, the maximum voltages, and the minimum voltages of the response of the voltage V(t), and the difference between the first current and the second current further comprises logic that calculates the worst-case impedance using the equation $$R_w = \frac{\sum_{i=0}^{M} |V_{2i} - V_{2i+1}|}{\Delta I_{dd}},$$

where $R_w$ is the worst-case impedance, M is the total number of pairs of measured voltages including the pre-transition voltage and the maximum and minimum voltages of to response, $V_x$ is the magnitude of the respective maximum and minimum voltages of the response, and $\Delta I_{dd}$ is the difference between the first current and the second current at the power input of the die.

22. The system of claim 18, wherein the logic that calculates the estimate of the worst-case voltage at the power input of the die further comprises logic that calculates an estimate of a maximum worst-case voltage.

23. The system of claim 18, wherein the logic that calculates the estimate of to worst-case voltage at the power input of the die further comprises logic that calculates an estimate of a minimum worst-case voltage.

* * * * *

UNITED STATES PATENT AND TRADEMARK OFFICE
CERTIFICATE OF CORRECTION

PATENT NO.        : 7,102,357 B2
APPLICATION NO.   : 10/805942
DATED             : September 5, 2006
INVENTOR(S)       : Isaac Kantorovich et al.

It is certified that error appears in the above-identified patent and that said Letters Patent is hereby corrected as shown below:

In column 5, line 19, delete "ti" before "$V_{wc,min}$".

In column 14, line 59, in Claim 1, delete "to" and insert -- the --, therefor.

In column 16, line 3, in Claim 7, delete "bused" and insert -- based --, therefor.

In column 16, line 8, in Claim 8, after "of" insert -- the --.

In column 17, line 2, in Claim 14, delete "pro-transition" and insert -- pre-transition --, therefor.

In column 17, line 11, in Claim 15, delete "end" and insert -- and --, therefor.

In column 17, line 22, in Claim 15, delete "pro-transition" and insert -- pre-transition --, therefor.

In column 17, line 25, in Claim 15, delete "$\alpha I_{dd}$" and insert -- $\Delta I_{dd}$ --, therefor.

In column 17, line 37, in Claim 17, delete "worst-cue" and insert -- worst-case --, therefor.

In column 17, line 52, in Claim 18, delete "voltage," and insert -- voltage --, therefor.

UNITED STATES PATENT AND TRADEMARK OFFICE
CERTIFICATE OF CORRECTION

PATENT NO. : 7,102,357 B2
APPLICATION NO. : 10/805942
DATED : September 5, 2006
INVENTOR(S) : Isaac Kantorovich et al.

It is certified that error appears in the above-identified patent and that said Letters Patent is hereby corrected as shown below:

In column 18, line 9, in Claim 19, delete "pro-transition" and insert -- pre-transition --, therefor.

In column 18, line 44, in Claim 21, delete "to" and insert -- the --, therefor.

In column 18, line 54, in Claim 23, delete "to" and insert -- the --, therefor.

Signed and Sealed this

Twenty-first Day of July, 2009

JOHN DOLL
*Acting Director of the United States Patent and Trademark Office*